United States Patent [19]
Scholz et al.

[11] Patent Number: 6,109,927
[45] Date of Patent: *Aug. 29, 2000

[54] CONNECTOR FOR ADJACENT CIRCUIT-BEARING SUBSTRATES

[75] Inventors: James Paul Scholz, Mechanicsburg, Pa.; Cheng-Thye Tan, Singapore, Singapore

[73] Assignee: The Whitaker Corporation, Wilmington, Del.

[ * ] Notice: This patent issued on a continued prosecution application filed under 37 CFR 1.53(d), and is subject to the twenty year patent term provisions of 35 U.S.C. 154(a)(2).

[21] Appl. No.: 09/141,120

[22] Filed: Aug. 27, 1998

[51] Int. Cl.[7] ....................................... H05K 1/00
[52] U.S. Cl. ................................ 439/65; 439/67
[58] Field of Search .................... 439/65, 66, 67

[56] References Cited

U.S. PATENT DOCUMENTS

| | | | |
|---|---|---|---|
| 4,348,071 | 9/1982 | Hsieh | 339/75 |
| 4,634,195 | 1/1987 | Shoemaker | 339/17 F |
| 4,998,886 | 3/1991 | Werner | 439/66 |
| 5,026,290 | 6/1991 | Dery | 439/65 |
| 5,263,868 | 11/1993 | Renn et al. | 439/67 |
| 5,286,218 | 2/1994 | Sakurai et al. | 439/444 |
| 5,336,095 | 8/1994 | Walburn et al. | 439/67 |
| 5,788,515 | 8/1998 | Mitra et al. | 439/83 |
| 5,885,091 | 3/1999 | Belanger et al. | 439/67 |

*Primary Examiner*—Lincoln Donovan
*Assistant Examiner*—Chandrika Prasad

[57] ABSTRACT

A connector (10) for interconnecting circuits of adjacent circuit-bearing substrates (50, 60) includes a housing (12) having at least one contact-receiving cavity (20), and a contact (30) disposed in a respective contact-receiving cavity (20) and including a plate-like body section (32) secured in cavity (20). The contact (30) further includes a pair of elongate spring arm contact sections (40) initially co-extending from a common edge (34) of the body section (32) and outwardly from the cavity (20) and from a mounting face (14) of the housing (12). The elongate spring arm contact sections (40) have end portions (42) arcuately diverging from each other to free ends (44) to orient respective continuous arcuate edges (46) thereof to face away from the mounting face (14) to be engaged by associated circuit termini (52, 62) of respective ones of the circuit-bearing substrates (50, 60). The elongate spring arm contact sections (40) are independently deflectable toward the mounting face (14) under spring bias.

10 Claims, 3 Drawing Sheets

CONNECTOR FOR ADJACENT CIRCUIT-BEARING SUBSTRATES

FIELD OF THE INVENTION

The present invention is directed to a connector for interconnecting circuits of adjacent circuit-bearing substrates and, more particularly, to a connector that can interconnect respective traces on the circuit-bearing substrates.

BACKGROUND OF THE INVENTION

It is often desirable to interconnect circuits between two adjacent circuit-bearing substrate that are placed edge to edge with circuit termini adjacent the respective edges. In many applications the circuits on the respective substrates or circuit boards are formed in dense arrays with the typical pitch between adjacent contact pads being approximately one millimeter. The corresponding contacts in a connector, therefore, are relatively thin and are on the order of 0.1 to 0.5 millimeters. Thus, it is necessary to precisely align the circuit pads onto substrates with each other in at least one horizontal direction. The substrates, however, while being aligned in a first horizontal direction such that corresponding circuit termini are across from one another, may be slightly spaced from each other in a second horizontal direction of a plane and furthermore may also be spaced slightly vertically from one another owing to differences in thicknesses of the boards as well as positions within the electronic equipment in which the boards are used.

U.S. Pat. No. 5,263,868 discloses a flexible circuit interface for co-planar printed circuit boards. The connector includes a support housing and a flexible jumper circuit for bridging the printed circuit boards that abut each other. The flexible circuit includes an elastomeric member that can bridge the interface between the co-planar boards. To maintain the desired normal force of the connector over time, it is desirable that the elastomeric member be supported by a continuous surface, rather than by surfaces spaced by a gap or step. Additionally, the resiliency of the elastomeric member can be affected over time by changes in the environment, such as temperature variations, and when subject to continual vibrations or the like.

It is desirable, therefore, that the electrical connector be able to interconnect corresponding circuit termini on the boards while accommodating slight differences in horizontal and vertical arrangements of the substrates. The connector, therefore, needs to be able to interconnect corresponding circuit termini across a gap as well as up a step and to maintain the desired normal force on the circuit termini over time, even when subject to changes in temperature and vibrations.

SUMMARY OF THE INVENTION

The present invention is directed to a connector for interconnecting circuits of adjacent circuit-bearing substrates that are placed edge to edge with circuit termini adjacent the edges. The connector includes at least one contact-receiving cavity and a contact disposed therein. The contact includes a plate like body section secured in the cavity and a pair of elongate spring arm contact sections initially co-extending from a common edge of the body section and outwardly of the contact-receiving cavity and from a mounting face of the housing. The spring arm contact sections have end portions arcuately diverging from each other, all within the plane of the body section to free ends to orient respective continuous arcuate edges to face away from the mounting face. The arcuate edges engage associated circuit termini of respective ones of the circuit-bearing substrates. Each elongate spring arm contact section is independently deflectable toward the mounting face under spring bias upon engagement with the termini under compression there against such that the circuit-bearing substrates can vary relatively in distance from the mounting face and from each other.

The connector can be used to engage corresponding circuit termini on two circuit-bearing substrates that abut one another as well as substrates having a gap and/or a step between them.

An embodiment of the invention will now be described with reference to the accompanying drawings.

DETAILED DESCRIPTIONS OF AN EMBODIMENT OF THE INVENTION

Figure 3:
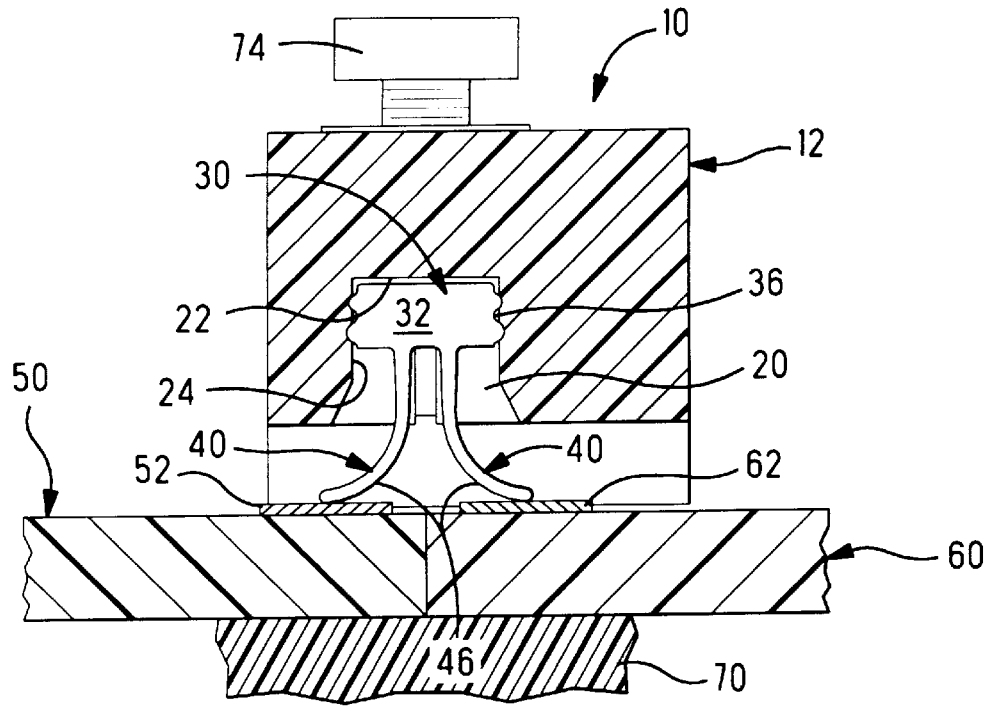
FIG. 3 is a cross-sectional view of the connector of FIG. 2 mounted to two adjacent co-planar circuit-bearing substrates.

Referring now to FIGS. 1 through 5, connector 10 for interconnecting circuits of adjacent circuit-bearing substrates 50, 60 having circuit termini 52, 62 adjacent edges thereof, includes a housing 12 having at least one contact-receiving cavity 20 and a contact 30 disposed therein. The contact-receiving cavity 20 includes a top wall 22 and opposed side walls 24 and is open to the mounting face 14 of housing 12, as seen in FIG. 3.

For purposes of illustration, connector 10 is shown being used in an electrical article 64 that is mountable to a base 70 of an electronic apparatus. Housing 12 further includes mounting portions 16 having apertures 18 extending therethrough for receiving fastening devices 74 for securing connector 10 to electrical article 64 and to base 70. Each fastening device 74 extends through a respective washer 75, an insert 76 disposed in housing aperture 18, a respective aperture 66 in article 64 and are secured in a threaded aperture 72 of base 70. Insert 76 has a diameter dimensioned to be received in aperture 18 in an interference fit and a length selected to be at least equal to the depth of aperture 18, thereby preventing the housing 12 from being damaged when the fastening device 74 is secured to base 72. Additionally the upper surface of insert 76 provides a stop surface for fastening device 74. The length of fastening device 74 and insert 76 are selected to apply the desired amount of compression force against housing 12 and the contacts 30 therein to assure electrical connection between the circuit termini 52, 62. It is to be understood that other types of fastening devices may also be used.

Figure 5:
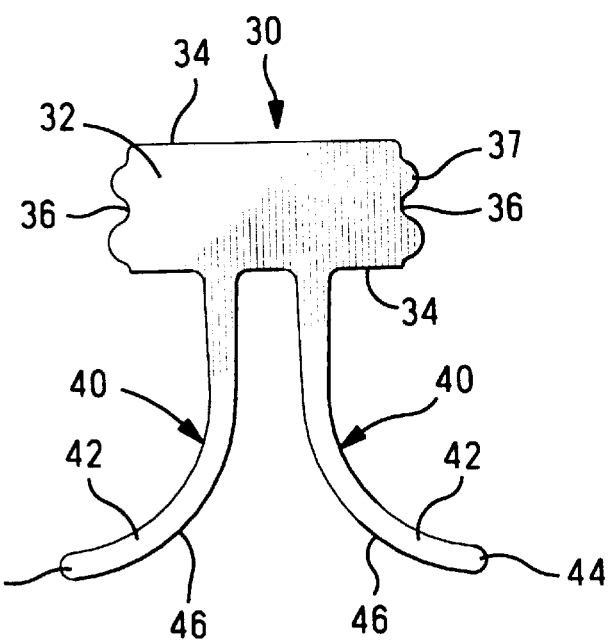
FIG. 5 is plan view of a contact made in accordance with the invention.

Contact 30, as best seen in FIG. 5, includes a plate-like body section 32 having two pairs of opposed edges 34, 36 respectively, and a pair of elongate spring arm contact sections 40 co-extending from a common edge 34 of the body section 32 and outwardly from the contact-receiving cavity 20 when the contact 30 is secured in housing 12. Each contact 30 is secured in a respective cavity in an interference fit whereby the edges 36 include a plurality of protrusions 37 that engage the inner surfaces of side walls 24 of cavity 20. The elongate spring arm contact sections 40 have end portions 42 arcuately diverging from each other, all within the plane of the body section to free ends 44 to orient respective continuous arcuate edges 46 thereof to face away from the mounting face 14. The arcuate edges 46 are adapted to be engaged by associated circuit termini 52, 62 of respective ones of the circuit-bearing substrates 50, 60. The elongate spring arm contact sections 40 are independently deflectable toward the mounting face 14 of housing 12 under spring bias upon engagement with circuit termini 52, 62 when compressed there against such that the circuit-bearing substrates 50, 60 can vary relatively in distance from the mounting face 14, (Y axis) and from each other (X axis), as shown representatively in FIG. 4. The corresponding termini 52, 62 are aligned in the direction (Z axis).

Figure 4:
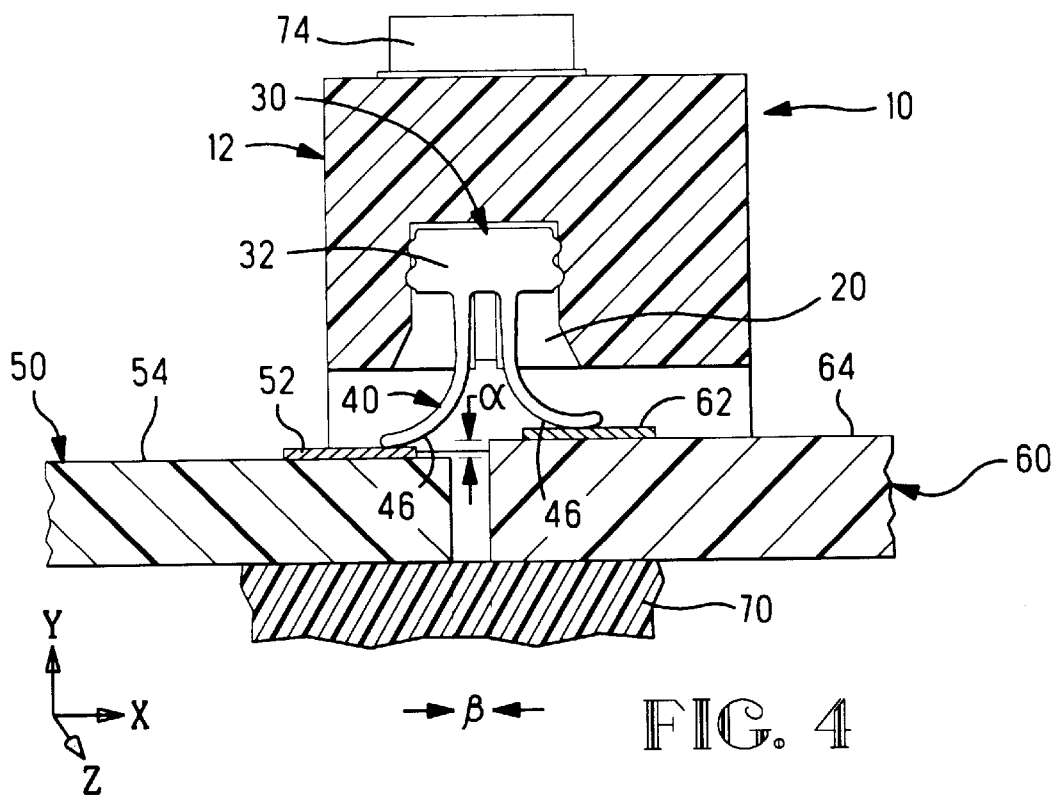
FIG. 4 is a view similar to that of FIG. 3 wherein the substrates are spaced from each other in both in a horizontal as well as a vertical direction.

FIGS. 3 and 4 illustrate the cross-sectional view of the connector 10 mounted to circuit board wherein the adjacent substrates 50, 60 lie in a common plane in FIG. 3 and in FIG. 4 they are separated vertically by a distance α and horizontally by a distance β. The circuit-bearing substrates or circuit boards 50, 60 are aligned such that the corresponding circuit termini 52, 62 are in alignment with each other with respect to the Z direction in the apparatus, spaced apart or adjacent in the X direction and co-planar or vertically spaced in the Y direction as shown in FIG. 4.

In accordance with the invention the housing is made from a dielectric material such as a liquid crystal polymer or other material, as known in the art, that is suitable for use in the desired type of environment. The terminals are stamped from a strip of metal, such as beryllium copper, phosphor bronze or the like.

Figure 1:
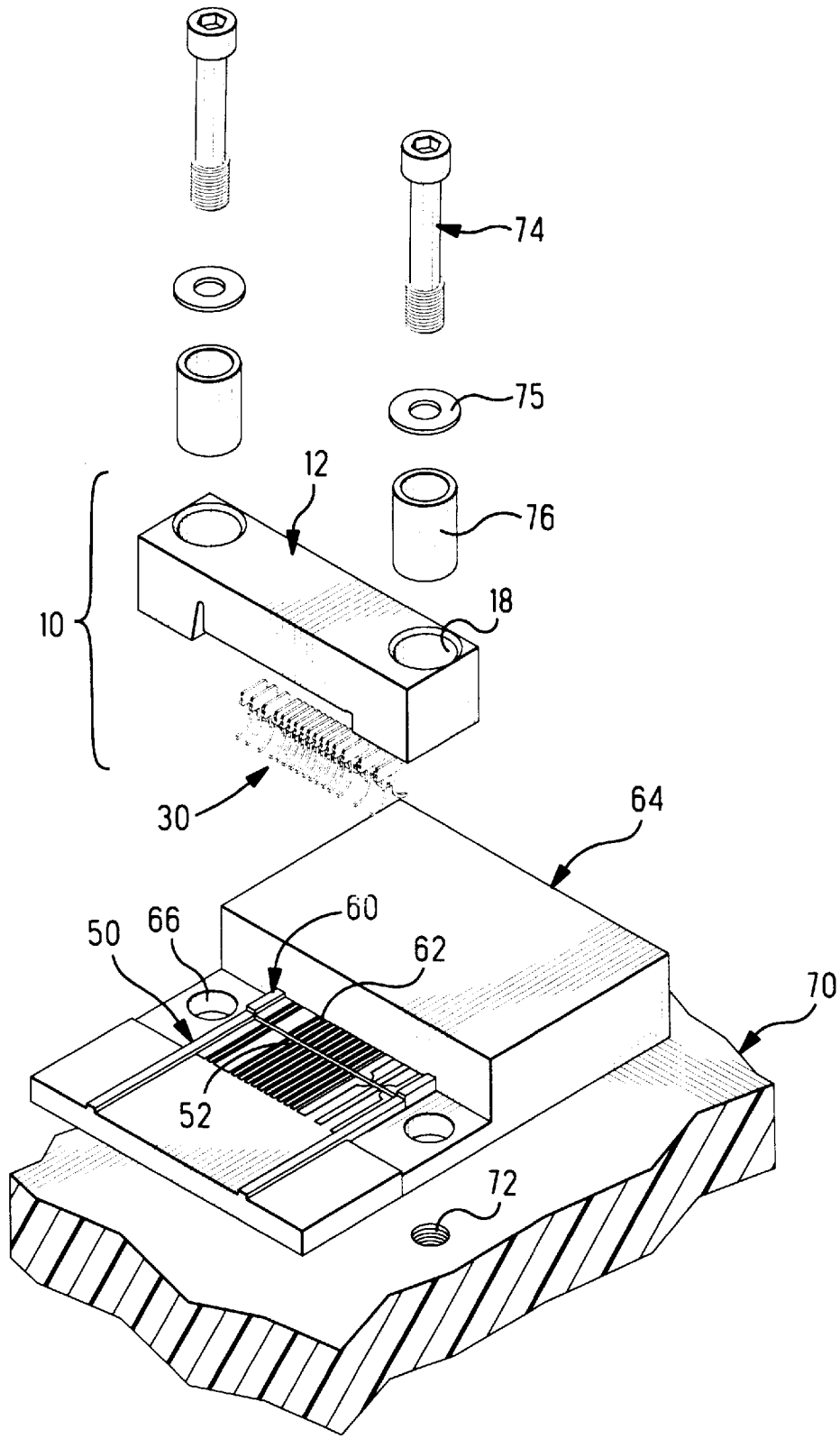
FIG. 1 is an isometric view of an electronic assembly including an electrical connector made in accordance with the invention exploded from two circuit-bearing substrates and from a fragmentary portion of a base of the assembly.
Figure 2:
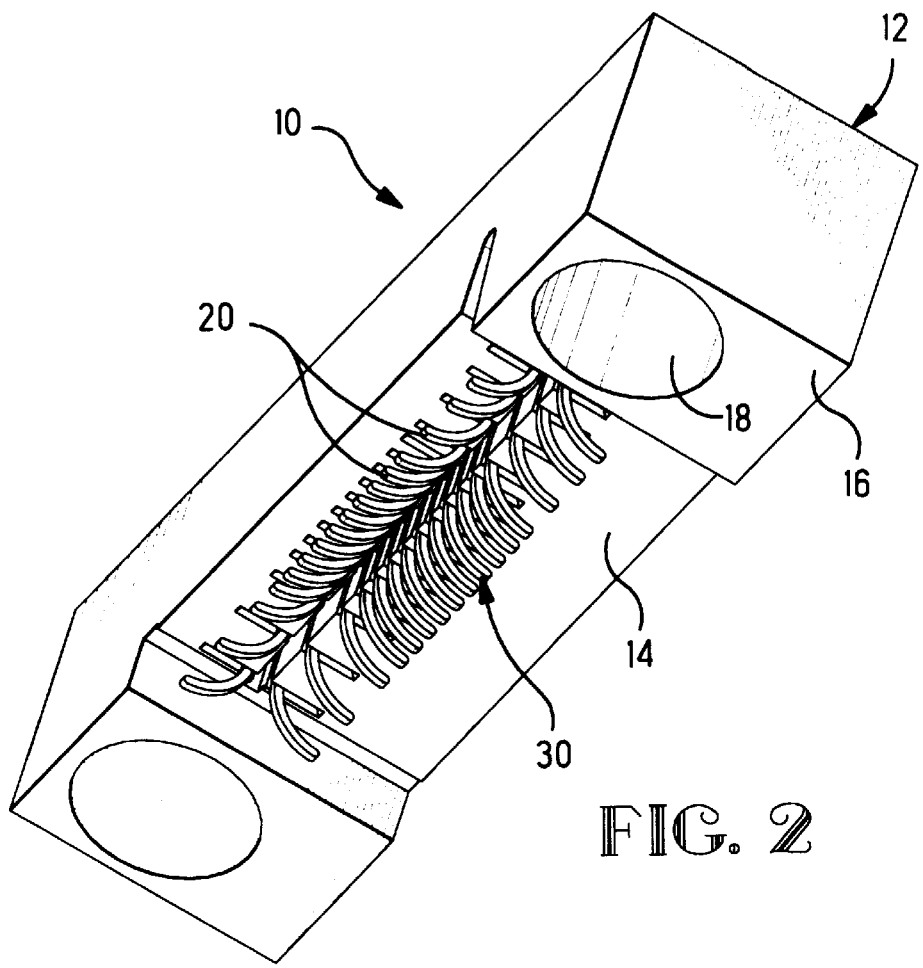
FIG. 2 is an isometric view of the connector of FIG. 1 as viewed from the mounting face thereof.

In the embodiment shown in FIGS. 1, 3 and 4, the mounting portions 16 of housing 12 are secured to base 70. In FIG. 3, the base 70 extends beneath the coplanar circuit-bearing substrates 50, 60. Substrates 50 and 60 are of the same thickness, such that the corresponding upper and lower surfaces lie on respective common planes. In FIG. 4, the circuit-bearing substrates 50, 60 are of different thicknesses resulting in vertical difference α. The lower surfaces of the substrates lie on the same plane, but the upper surfaces are on different planes.

The connector of the present invention provides a contact having resilient legs that can adjust to differences in height (step) and spacing (gap) between aligned circuit termini on adjacent circuit-bearing substrates. The resilient spring arms provide sufficient normal force to retain the connection for each individual trace independently and compensate for variances in a gap or step between the two boards. The spring arms maintain their resiliency when subject to changes in temperature and when used in an apparatus that is subject to periodic or continual vibrations. Additionally, the connector of the present invention can be removed from a first location having a first gap and step arrangement and used in a second location having a second gap and step arrangement.

It is thought that the connector of the present invention and many of its attendant advantages will be understood from the foregoing description. It is apparent that various changes may be made in the form, construction, and arrangement of parts thereof without departing from the spirit or scope of the invention, or sacrificing all of its material advantages.

We claim:

1. A connector for interconnecting circuits of adjacent circuit-bearing substrates placed edge to edge with circuit termini adjacent said edges, comprising:

a housing including one or more contact-receiving cavities, and one contact disposed in each respective cavity, each contact including a plate-like body section secured in said cavity;

each contact further including a pair of elongated spring arm contact sections initially co-extending from a common edge of said body section and outwardly from its respective cavity and from a mounting face of said housing;

said elongated spring arm contact sections having end portions arcuately diverging from each other, all within the plane of the body section to free ends to orient respective continuous arcuate edges thereof to face away from said mounting face to be engaged by associated circuit termini of respective ones of said circuit-bearing substrates;

whereby said elongated spring arm contact sections are independently deflectable toward said mounting face under spring bias upon engagement with said circuit termini under compression thereagainst such that said circuit-bearing substrates can vary relatively in distance from said mounting face and from each other.

2. The connector of claim 1, wherein the housing has fastening means for fastening the connector to an electrical article which houses the adjacent circuit-bearing substrates.

3. The connector of claim 2, wherein the fastening means are threaded fasteners which extend through apertures in the housing into the electrical article to threadedly secure the connector to the electrical article.

4. The connector of claim 3, wherein the threaded fasteners extend through apertures in both the housing and the electrical article and then into a base to secure the connector and the electrical article to the base.

5. The connector of claim 1, wherein the plate-like body section of each contact has a plurality of projections extending outwardly from opposing edges of the plate-like body for interferingly retaining the contact within its respective contact-receiving cavity.

6. A connector for interconnecting circuits of adjacent circuit-bearing substrates placed edge to edge with circuit termini adjacent the edges, the connector comprising:

a housing having a plurality of contact receiving cavities, each contact receiving cavity housing one respective contact, each contact having a body section and two opposing spring arms extending outwardly from said body section in a mating direction, the spring arms having end portions arcuately diverging from each other, the spring arms thereby forming an electrical mating interface for engaging the adjacent circuit termini wherein each spring arm is independently deflectable toward the housing under compression such that the circuit-bearing substrates can vary relatively in distance from the housing and from each other.

7. The connector of claim 6, wherein the body section of each contact is a plate-like body having a top edge, two opposite side edges and a bottom edge, the spring arms extending outwardly from the bottom edge.

8. The connector of claim 7, wherein the side edges of each contact have a plurality of projections for facilitating an interference fit of the contact within its respective contact receiving cavity.

9. The connector of claim 6, wherein the housing has a fastening means for securing the connector to an electrical article which has adjacent circuit-bearing substrates.

10. The connector of claim 9, wherein the fastening means is at least one threaded member extending through at least one respective aperture in the housing and into the electrical article for threadedly securing the connector to the electrical article.

* * * * *